(12) United States Patent
Nguyen et al.

(10) Patent No.: US 6,437,639 B1
(45) Date of Patent: Aug. 20, 2002

(54) PROGRAMMABLE RC FILTER

(75) Inventors: Thanh Van Nguyen, Temple; Hashem Farrokh, Schnecksville, both of PA (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/618,455

(22) Filed: Jul. 18, 2000

(51) Int. Cl.[7] .................................................. H03K 5/00
(52) U.S. Cl. ....................... 327/558; 327/311; 327/553; 333/172; 333/173
(58) Field of Search ................................ 327/311, 552, 327/553, 554, 555, 556, 557, 558, 559, 344, 437, 308; 333/172, 173

(56) References Cited

U.S. PATENT DOCUMENTS 5,268,847 A * 12/1993 Otetz et al. .................. 346/607
5,572,167 A * 11/1996 Alder et al. ..................... 331/2
6,091,289 A * 7/2000 Song et al. ................. 327/558

FOREIGN PATENT DOCUMENTS

JP        403065812 A  *  3/1991  ................. 327/552

\* cited by examiner

Primary Examiner—Dinh T. Le
(74) Attorney, Agent, or Firm—Harness, Dickey & Pierce, P.L.C.

(57) ABSTRACT

A programmable resistive-capacitive filter circuit enabling on-chip digital control of the frequency response includes a switched resistive type voltage divider network where one of the resistors forms an element of an RC filter and wherein the voltage divider additionally provides a DC bias on an output terminal. One preferred embodiment of the invention is directed to a programmable bandpass filter including MOSFET type semiconductor devices which are utilized as switched resistive elements of the filter.

19 Claims, 5 Drawing Sheets

PROGRAMMABLE RC FILTER

BACKGROUND OF THE INVENTION

1. Field of the Invention

This invention relates generally to an apparatus for controlling the frequency response of an electrical signal filter and more particularly to a programmable resistor-capacitor filter suitable for VLSI integrated circuits.

2. Description of Prior Art

Electrical signal filters comprised of a combination of electrical impedances such as resistors(R) and capacitors(C) are well known and are used extensively in all types of electrical and electronics apparatus.

Typically RC filters fall into two classes, low-pass filters and high-pass filters. For example, FIG. 1 discloses a simple low-pass filter comprised of a single fixed resistor 10 and capacitor 12 connected between an input terminal 14 and an output terminal 16. The resistor 10 is connected in series between input and output terminals 14 and 16 while the capacitor is connected between a common junction 18 between the RC components and a point of reference potential shown as ground.

FIG. 2 on the other hand depicts a simple high-pass filter consisting of a resistor 10 and a capacitor 12 but now the resistor 10 is returned to ground from junction 18 while the capacitor 12 is connected in series between the input and output terminals 14 and 16. The filter circuits shown in FIGS. 1 and 2 have a single corner of frequency response depending upon the selected values of the resistor 10 and the capacitor 12.

Where there is a need to vary the corner of the frequency response low-pass and high-pass filters on demand, a plurality of resistors and capacitors have been used which are selectively switched in and out of a filter circuit. For example, FIG. 3 is illustrative of a switched resistor approach for implementing a high-pass filter and includes a single capacitor 12 and a plurality of fixed resistors $10_1$, $10_2$, ... $10_{n-1}$, and $10_n$ which are connectable between one side of the capacitor 12, as shown by reference numeral 22 and ground by means of a set of electrically controlled switch devices $24_1$, $24_2$, ... $24_n$. These switches are respectively closed or opened in response to control signals applied from a control source, not shown, to terminals $26_1$, $26_2$, ... $26_n$. The control source may be, for example, a multi-bit control register where each bit determines which resistor is to be connected into the circuit. In the circuit configuration shown in FIG. 3, one or all of the fixed resistors $10_1$ ... $10_n$ could be connected in parallel between 22 and ground. In such a configuration, a large coupling capacitor 28 is typically included between the output terminal 16 and the filter components to provide DC isolation due to the shunting effect of the high-pass filter resistors $10_1$, ... $10_n$.

In a like manner, a plurality of capacitors can be utilized in a switched circuit configuration for implementing a high-pass filter. This is shown in FIG. 4. Now a plurality of fixed capacitors $12_1$, $12_2$, ... $12_n$ and series connected switches $24_1$, $24_2$, ... $24_n$ are connectable in parallel between the input terminal 14 and one side of the grounded resistor 10 as shown by reference numeral 23. As before, the controlled switches $24_1$, $24_2$, ... $24_n$ are open and closed in response to control signals applied to terminals $30_1$, $30_2$, ... $30_n$. Thus, depending upon which capacitor, for example, $12_1$ or a combination of parallel capacitors $12_2$, ... $10_n$ is switched into the circuit a high-pass filter characteristic can be selectively programmed or changed as desired. Again, a large coupling capacitor 28 is connected between the filter and output terminal 16 to provide the required isolation between the low-pass filter and the circuitry 10 connected to the output terminal 16.

Where such circuitry is desired for use in connection with on-chip digital control of RC filters fabricated in a VLSI integrated circuit, both approaches as shown in FIGS. 3 and 4 suffer from an inherent disadvantage in that relatively large coupling capacitors are required to provide the necessary DC isolation due to the shunting effect of the resistors. Also, in the switched capacitor approach, as shown in FIG. 4, a relatively large area is required on the chip due to the need of multiple capacitors which by their very nature consumes an inordinate amount of space, i.e. area, on the structure.

SUMMARY

Accordingly, it is an object of the present invention to provide improvement in electrical signal filters.

It is another object of the invention to provide improvement in programmable RC filters which are suitable for very large scale integrated circuits.

It is yet another object of the invention to provide a programmable RC filter which overcomes both size and isolation limitations of the prior art.

These and other objects are achieved by a modified switched resistor approach which overcomes the limitations of the prior art and involves the use of a resistive type voltage divider network where one of the resistors comprises one element of the filter and wherein the voltage divider also provides a DC bias to the circuitry coupled to the output of the filter.

In one aspect of the invention, there is provided a filter comprised of a resistive component and a capacitive component connected together in an electrical filter circuit configuration between an input terminal and an output terminal and having a predetermined frequency response and wherein the resistive component comprises one element of at least one voltage divider circuit connected across a DC voltage source so to provide a substantially fixed DC voltage of a predetermined magnitude at the output terminal In another aspect of the invention, there is provided a filter comprised of a capacitor connected between an input terminal and an output terminal, and a plurality of switched voltage dividers being connected between a source of DC voltage and point of reference potential, each of said voltage dividers including at least two series connected circuit elements having an electrical resistance chracteristic and having a common circuit connection therebetween, said common circuit connection being commonly connected to said capacitor and said output terminal and thereby providing a DC bias voltage at said output terminal.

In yet another aspect of the invention, there is provided a filter comprised of a high-pass filter section including a first capacitor connected between an input terminal and an intermediate circuit junction, and a plurality of switched voltage dividers each including at least a pair of resistive circuit elements connected across a source of DC voltage and wherein said at least one resistive element is connected to a point of reference potential or ground, each of the voltage dividers having a series circuit connection commonly connected to the intermediate circuit junction, and wherein the voltage dividers are selectively switched in and out of circuit relationship such that one resistive element of said pair of resistive circuit elements and said first capacitor form a filter circuit having a programmable high-pass frequency response, and a low-pass filter section including a plurality of switched resistive circuit elements selectively connected in parallel between the intermediate circuit junctions and an output terminal, and a second capacitor connected between one side of said switched resistive elements common to the output terminal and said point of reference potential or ground, and wherein at least one resistive element of said switched resistive elements is switched into circuit relationship with the second capacitor so as to form a filter circuit having a programmable low-pass frequency response, and wherein a DC bias voltage is provided at said output terminal.

Where active semiconductor devices such as field effect transistors are utilized as the resistive elements of the filter, such an implementation utilizes very little area and consumes only a small amount of power on a semiconductor integrated circuit chip.

Further scope of applicability of the present invention will become apparent from the detailed description which follows. It should be noted however that the detailed description and specific examples, while indicating preferred embodiments of the invention, are provided by way of illustration only, since various changes and modifications coming within the spirit and scope of the invention will become apparent to those skilled in the art from this detailed description.

DETAILED DESCRIPTION OF THE DRAWINGS

The present invention will become more fully understood when considered in conjunction with the accompanying drawings which are provided only for purposes of illustration and thus are not meant to be considered in a limiting sense, and wherein.

DETAILED DESCRIPTION OF THE INVENTION

Having discussed above what is considered to be the relevant prior art, the present invention is directed to an improved filter circuit which allows control of two desired parameters, a DC bias voltage which is provided at the output and the frequency response characteristic of a filter and one which requires very little space on a semiconductor chip and requires very little power.

Figure 5:
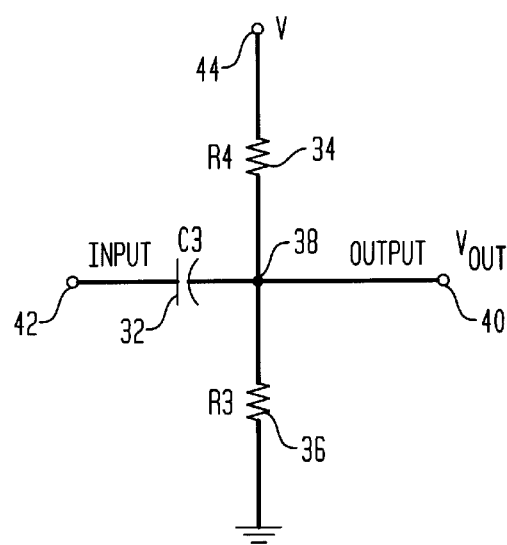
FIG. 5 is a simplified electrical schematic diagram of a high-pass filter circuit which is also adapted to provide a DC bias voltage on the output.

In its simplest form, FIG. 5 discloses a schematic of a high-pass electrical signal filter the resistive element of which also comprises one element of a voltage divider. As shown, the filter circuit includes a fixed capacitor 32 and two fixed resistors 34 and 36, the latter components being coupled in series across a voltage V with a common connection therebetween 38 and also being connected to one side of the capacitor 32 and an output terminal 40. An input terminal 42 is connected to the other side of the capacitor 32.

Figure 1:
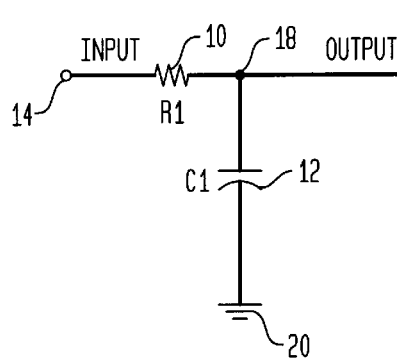
FIG. 1 is a simple electrical schematic diagram illustrative of a low-pass filter.

As is well known, a low-pass filter such as shown in FIG. 1 includes a frequency response which has a high frequency corner (HFC) which can be defined by the equation:

$$HFC = \tfrac{1}{2}\pi\, R1C1 \qquad (1)$$

Figure 2:
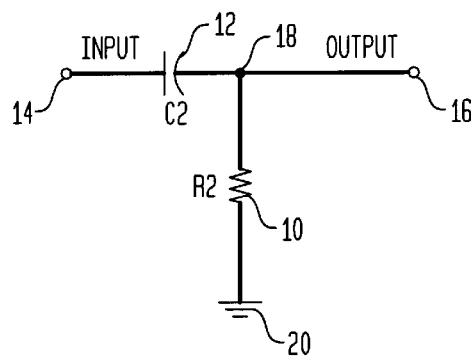
FIG. 2 is a simple electrical schematic diagram illustrative of a high-pass filter.

In a like manner, a high-pass filter such as shown in FIG. 2 includes a low frequency corner or LFC which can be defined as:

$$LFC = \tfrac{1}{2}\pi R2C2 \qquad (2)$$

With respect to the high-pass filter of FIG. 5, the value of R1 in equation (1) now becomes the parallel combination of R3 and R4 which can be expressed as:

$$R = R3R4/(R3+R4) \qquad (3)$$

and therefore, the high frequency corner (HFC) will be:

$$HFC = \tfrac{1}{2}\pi RC3. \qquad (4)$$

Also in FIG. 5, the DC bias potential $V_{out}$ at the output terminal will be:

$$V_{out} = VR3/(R3+R4) \qquad (5)$$

Equation 5 indicates that the value of the DC bias voltage can be set by selection of the suitable values of R3 and R4. Further, it can be seen from the above equations that an arbitrary pair of values for LFC and $V_{out}$ can be resolved simultaneously by solving equations (3) and (5) simultaneously.

Figure 6:
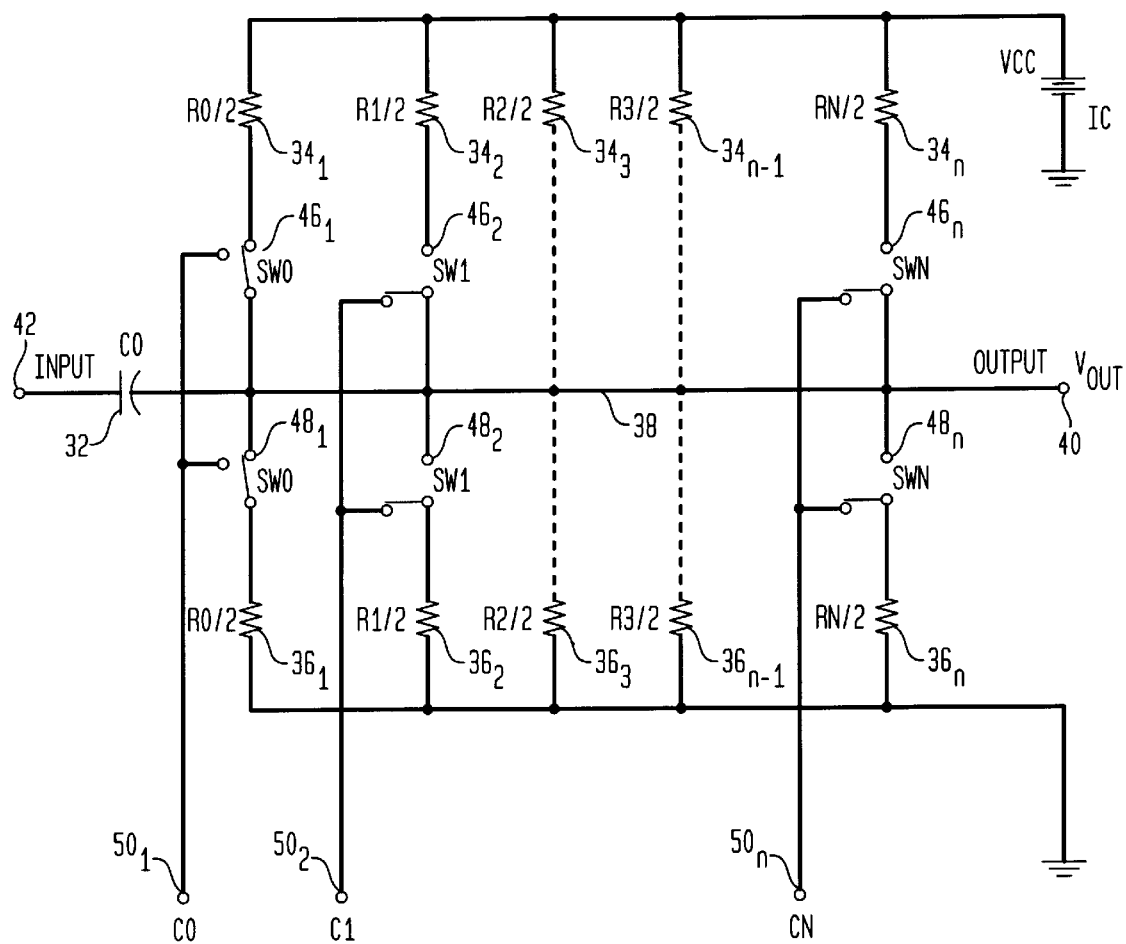
FIG. 6 is an electrical schematic diagram illustrative of a switched resistor embodiment of the filter circuit shown in FIG. 5.

This now leads to a consideration of a programmable high-pass RC filter which can be achieved by a switched resistor arrangement shown in FIG. 6. As shown, FIG. 6 includes a single filter capacitor 32 and a plurality of resistive voltage dividers consisting of resistors $34_1, \ldots 34_n$ and $36_1, \ldots 36_n$, connectable to one side of capacitor 32 at 38 via electrically controlled switches $46_1, \ldots 46_n$, and $48_1 \ldots 48_n$ which are series connected to the individual resistors.

Figure 3:
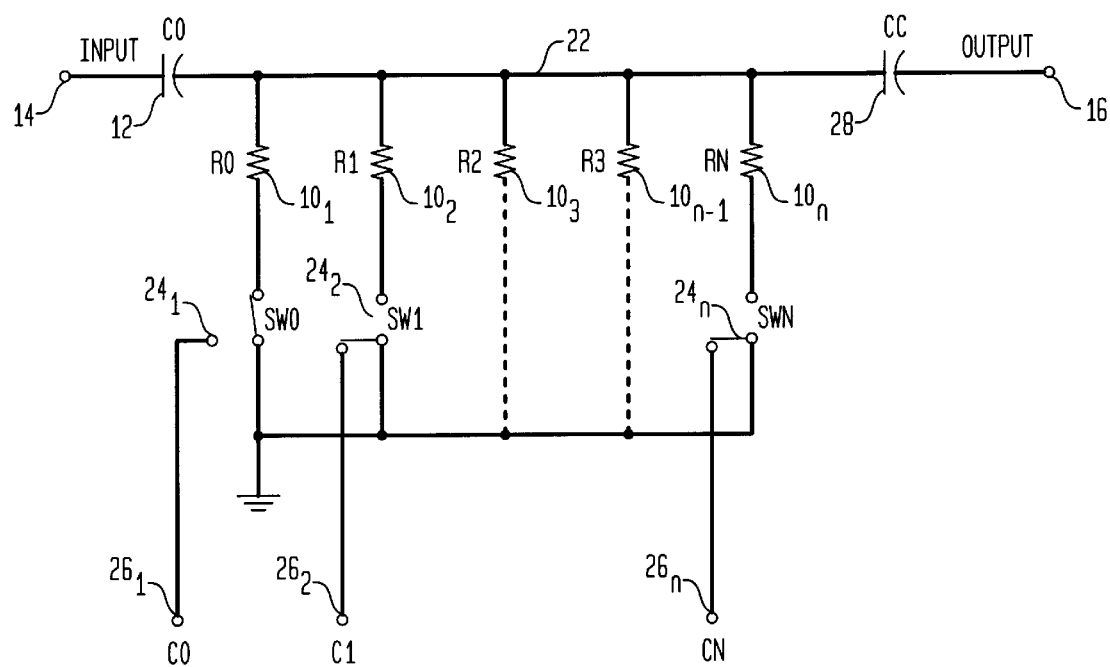
FIG. 3 is an electrical schematic diagram illustrative of a programmable high-pass filter utilizing switched resistors in the circuit.
Figure 4:
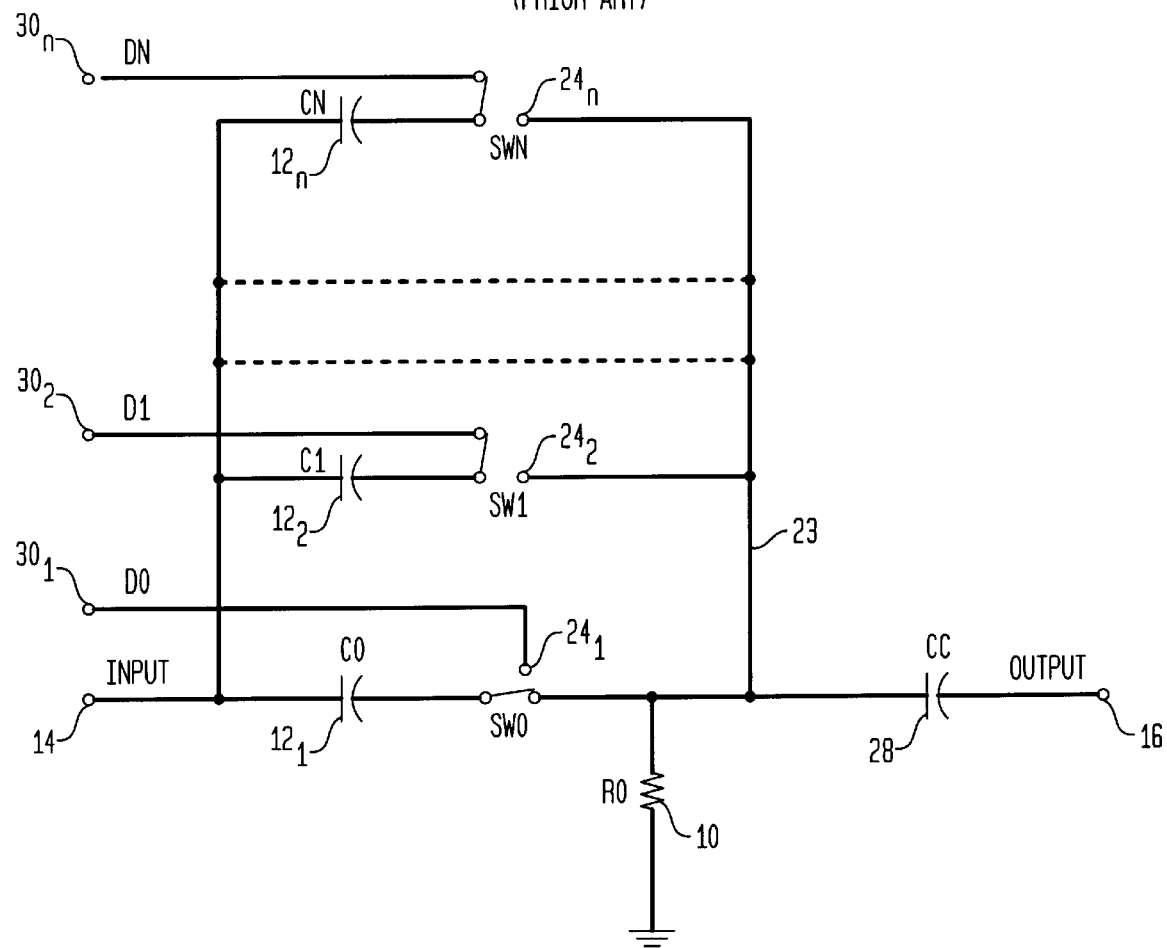
FIG. 4 is an electrical schematic diagram of a programmable high-pass filter utilizing switch capacitors in the circuit.

Further as shown in FIG. 6, the switches $46_1$ and $48_1$ are closed, while the switches $46_2, \ldots 46_n$, and $48_2 \ldots 48_n$ are open and in this regard resembles the switched resistor configuration in FIG. 3. Each pair of switches $46_1, 48_1, \ldots 46_n, 48_n$ are controlled by the same control signal applied to terminals $50_1, 50_2, \ldots 50_n$ from a control source such as a digital register. However, this filter circuit does not require a large coupling capacitor and provides a DC voltage component on the output voltage $V_{out}$ which does not shift with the proper design and selection of the values for the individual voltage dividers and can thus be used as a DC bias voltage for a circuit coupled to the output terminal 40. Thus, what is provided is a programmable RC filter which provides three basic advantages of: small size, self-bias, and symmetry.

Figure 7:
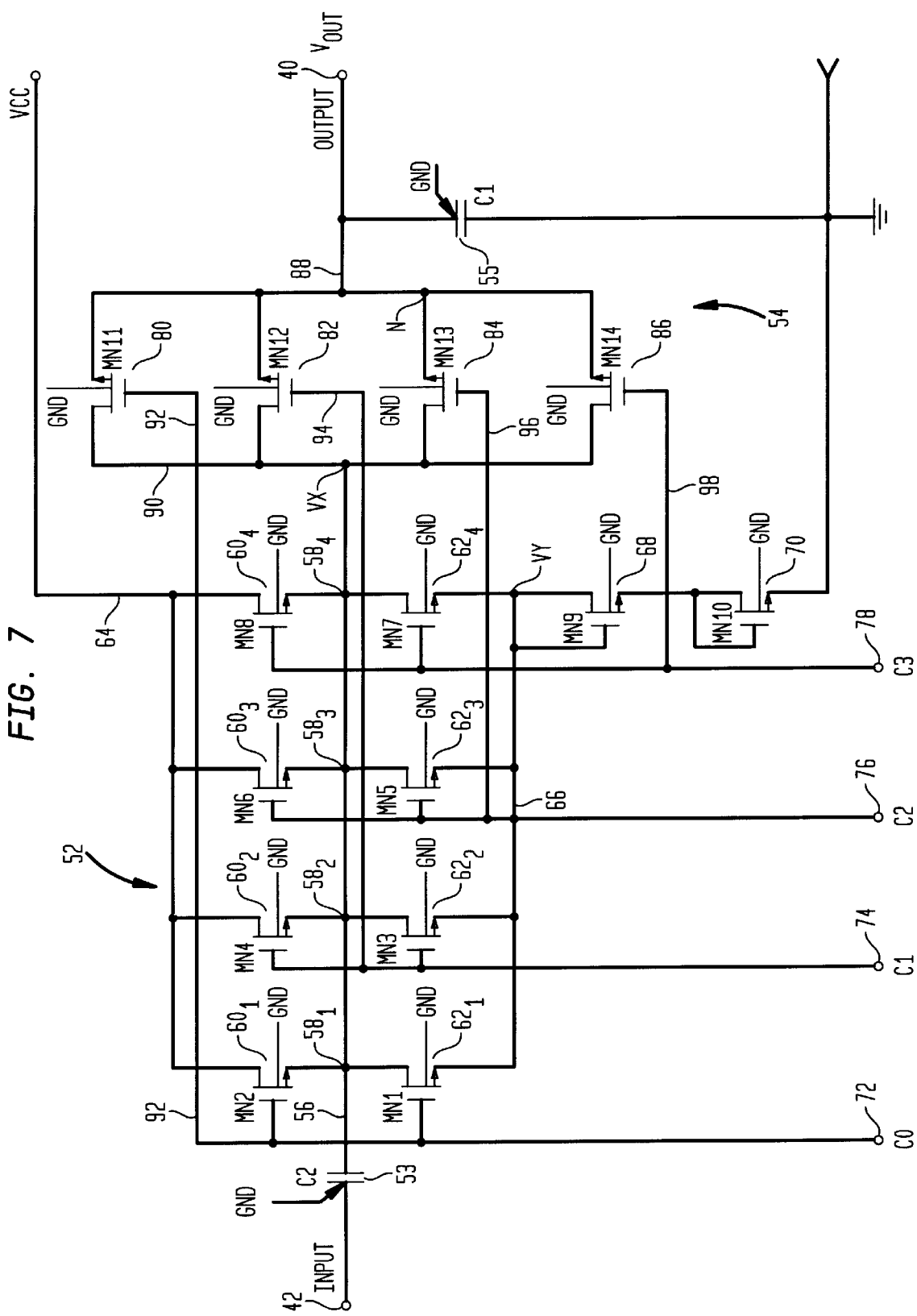
FIG. 7 is an electrical schematic diagram of an embodiment of the invention which utilizes active devices and operates as a programmable bandpass filter while additionally providing a DC bias voltage for circuitry connected to the output thereof.

This concept can be employed in the implementation of either a low pass, a high pass, or a bandpass filter, a preferred embodiment which is shown, for example, in FIG. 7, and where active semiconductor devices, such as CMOS field effect transistors, are utilized which operate as both switches and resistor elements. It should be noted, however, that when desirable bipolar junction transistors may be utilized.

Referring now to FIG. 7, reference numeral 52 is directed to the high-pass portion of the bandpass filter, while reference numeral 54 is directed to the low-pass portion of the filter. The high-pass portion 52, as shown, includes a fixed capacitor 53 having one side connected to the input terminal 42, while its opposite side is connected to a circuit junction shown as a signal lead 56 which is connected to a common point between the sources and drains of four pairs of cascoded or series connected MOSFETs $60_1, \ldots 60_4$, and $62_1 \ldots 62_4$. Further as shown, the drains of MOSFETs $60_1$, $60_2$, $60_3$, and $60_4$ are commonly connected to a $V_{cc}$ supply source via a power bus 64. The sources of MOSFETs $62_1$, $62_2$, $62_3$, and $62_4$ on the other hand, are commonly returned to ground via a pair of series connected MOSFETs 68 and 70, which have common gate-drain connections and act as a pair of diodes providing a voltage of $V_{cc}/2$ at circuit node VY.

The gate electrodes of the first pair of MOSFETs $60_1$ and $62_1$ are commonly connected to a control terminal 72. Likewise, the gates of MOSFET pairs $60_2, 62_2$; $60_3, 62_3$; and $60_4, 62_3$, are connected to respective control terminals 74, 76 and 78. Control terminal 72, 74, 76 and 78 are adapted to be connected to a control signal source such as a four bit digital control register, not shown, for providing programmability of the low frequency corner (LFC) of the high-pass section 52 by activation of one or more pairs of the MOSFETs included in the high-pass portion 52 of the filter.

The low-pass portion 54 of the filter shown in FIG. 7 shows a single fixed capacitor 55 connected from the output terminal to ground. The output terminal 40 is also commonly connected to the emitters of four parallel MOSFETs 80, 82, 84 and 86 via circuit lead 88. The drains of MOSFETs 80, 82, 84 and 86 are commonly connected to circuit lead 90 which is connected to circuit node VX which is common to circuit junction lead 56 and thus provides an intermediate circuit connection between the filter portions 52 and 54.

The gate electrodes of the parallel MOSFETs 80, 82, 84 and 86 are respectively connected to control terminals 72, 74, 76 and 78 via circuit leads 92, 94, 96 and 98. Thus, for example, MOSFET 80 is rendered conductive and non-conductive simultaneously with MOSFETs $60_1$, and $62_1$. Likewise, MOSFETs 82, 84, and 86 of the low-pass section 54 are rendered simultaneously conductive and nonconductive with pairs of MOSFETs $60_2, 62_2$; $60_3, 62_3$; and $60_4, 62_4$ of the high-pass section 52.

Figure 8:
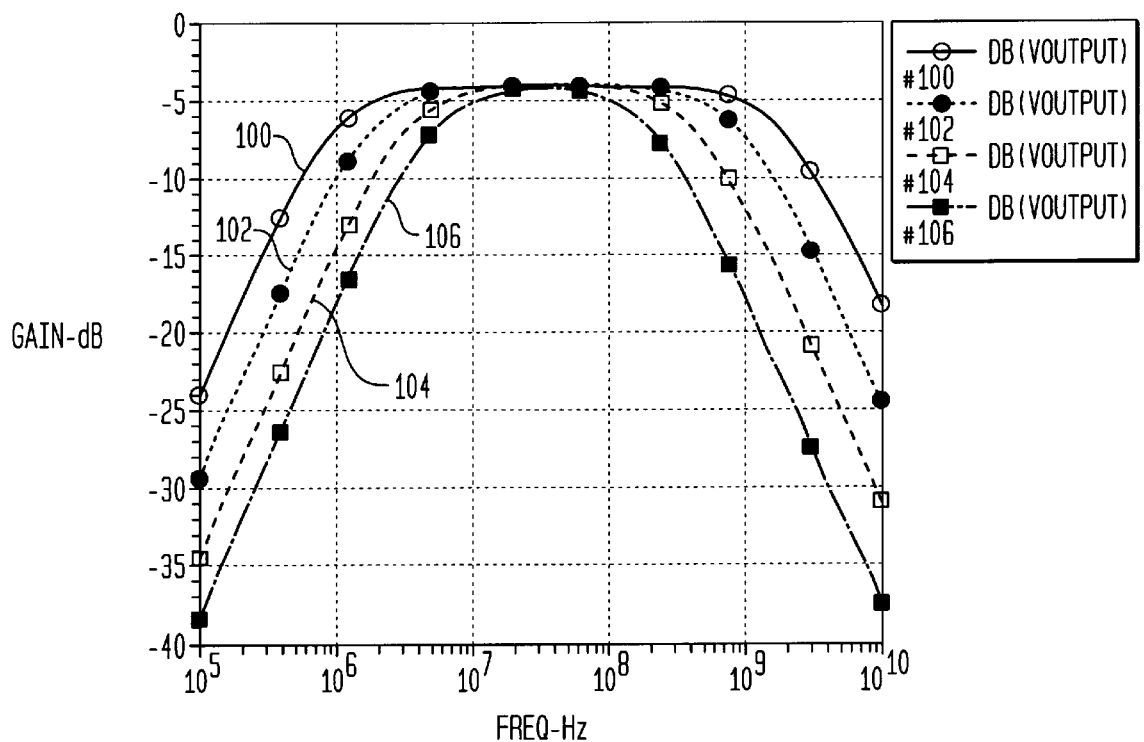
FIG. 8 is a set of characteristic curves illustrative of the gain vs. frequency response of the bandpass filter shown in FIG. 7.
Figure 9:
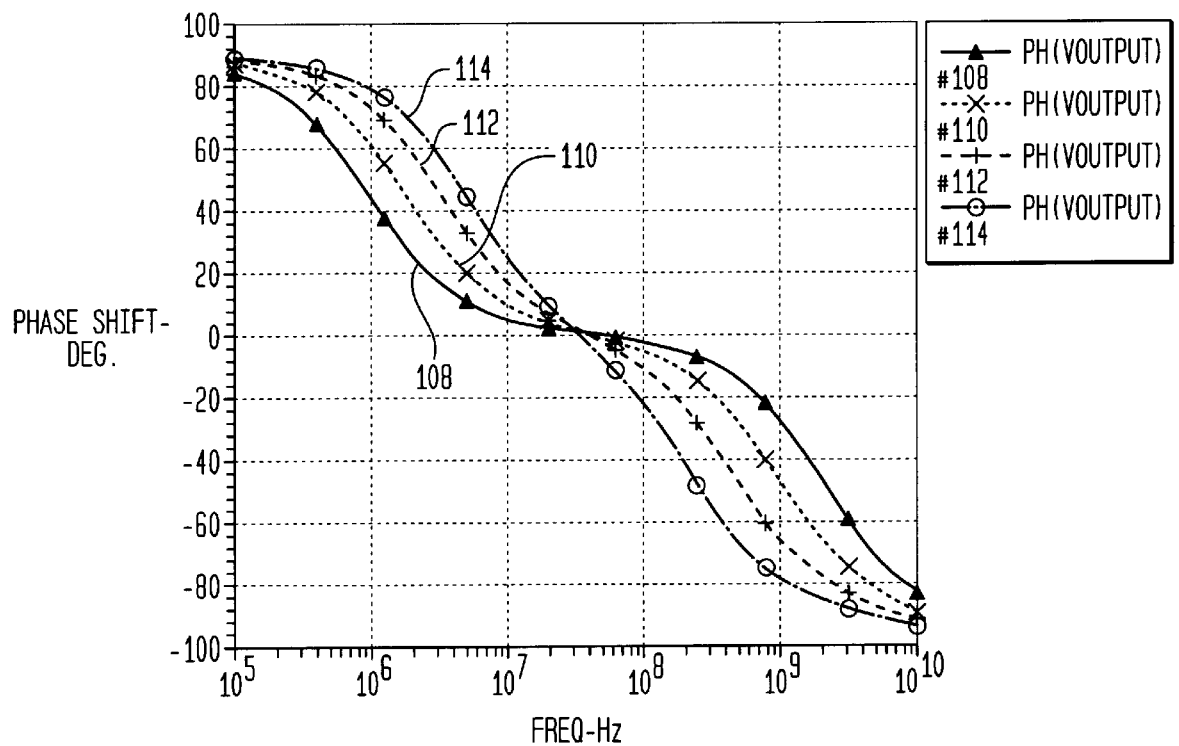
FIG. 9 is a set of curves illustrative of the phase shift vs. frequency characteristic of the bandpass filter shown in FIG. 7.

The gain and phase responses for the circuit shown in FIG. 7 are shown in FIGS. 8 and 9. FIG. 8, for example, indicates that the low frequency corner (LFC) begins at 0.5 MHz and is doubled in each succeeding bit over the frequency band of $1 \times 10^5$ Hz to $1 \times 10^{10}$ Hz, while the high frequency corner (HFC) begins at 2 GHz and is halved in each succeeding bit, as evidenced by the curves 100, 102, 104, and 106. The phase shift of the bandpass filter over the frequency band of $1 \times 10^5$ Hz to $1 \times 10^{10}$ Hz is shown by curves 108, 110, 112 and 114.

The bandpass filter shown in FIG. 7, will be less susceptible to process tolerance due to its symmetrical construction, which indicates higher obtainable performance in comparison to conventional approaches. Whereas the voltage dividers in FIG. 6 are implemented with resistors, and the voltage dividers in FIG. 7 are implemented with active devices, it should be understood that, when desired, a mixed combination of resistors and active devices can be utilized.

Having thus shown what is considered to be the preferred embodiment of the invention, it should be noted that the same has been made by way of illustration and not limitation. Accordingly, all modifications, alterations and changes coming within the spirit and scope of the invention as set forth in the appended claims are herein meant to be included.

What is claimed is:

1. A programmable high-pass filter providing a DC bias at an output, comprising:
    a capacitor connected between an input terminal and an output terminal;
    a plurality of switched voltage dividers being connected between a source of DC voltage and point of reference potential, each of said voltage dividers including at least two circuit elements having an electrical resistance characteristic and having a common circuit connection therebetween, said common circuit connection being commonly connected to said capacitor and said output terminal and thereby providing a DC bias voltage at said output terminal and
    wherein each of said circuit elements additionally include a series connected electrically controlled switch which is controlled by a control signal so as to open and close together in pairs for switching the circuit elements of each voltage divider selectively in and out of the filter and thereby control the frequency response of the filter as well as providing said DC bias voltage at said output terminal.

2. A programmable high-pass filter according to claim 1 wherein said circuit elements are comprised of active devices.

3. A programmable high-pass filter according to claim 2 wherein said active devices comprise semiconductor devices which operate both as a switch and a resistance element.

4. A programmable high-pass filter according to claim 3 wherein each said voltage divider includes a pair of active devices commonly controlled by a respective control signal.

5. A programmable high-pass filter according to claim 3 wherein said active devices are implemented in an integrated circuit.

6. A programmable bandpass filter, comprising:
    a high-pass filter section including a first capacitor connected between an input terminal and an intermediate circuit junction, and a plurality of switched voltage dividers each including at least a pair of resistive circuit elements connected across a source of DC voltage and wherein said at least one resistive element is connected to a point of reference potential or ground, each of the voltage dividers having a series circuit connection commonly connected to the intermediate circuit junction, and wherein the voltage dividers are selectively switched in and out of circuit relationship such that one resistive element of said pair of resistive circuit elements and said first capacitor form a filter circuit having a programmable high-pass frequency response; and
    a low-pass filter section including a plurality of switched resistive circuit elements selectively connected in parallel between the intermediate circuit junction and an output terminal, and a second capacitor connected between one side of said switched resistive elements common to the output terminal and said point of reference potential or ground, and wherein at least one resistive element of said switched resistive elements is switched into circuit relationship with the second capacitor so as to form a filter circuit having a programmable low-pass frequency response, and wherein a DC bias voltage is provided at said output terminal.

7. A programmable bandpass filter according to claim 6 wherein said capacitors and said resistive circuit elements reside in an integrated circuit.

8. A programmable bandpass filter according to claim 6 wherein said resistive circuit elements of said switched voltage dividers and said switched resistive circuit elements are comprised of passive resistors or active devices having an electrical resistance characteristic associated therewith.

9. A programmable bandpass filter according to claim 6 wherein each resistive circuit element of said switched voltage dividers and said switched resistive circuit elements are respectively comprised of at least one electrical resistor and a series connected electrically controlled switch.

10. A programmable bandpass filter according to claim 6 wherein each of said resistive circuit elements of said switched voltage dividers and said switched resistive circuit elements are respectively comprised of semiconductor devices.

11. A programmable bandpass filter according to claim 10 wherein said semiconductor devices are comprised of MOSFETs.

12. A programmable bandpass filter according to claim 10 wherein said semiconductor devices are comprised of field effect transistors or bipolar junction transistors.

13. A programmable electrical signal filter, comprising:

a resistive component and a capacitive component connected together in an electrical filter circuit between an input terminal and an output terminal, and wherein the resistive component comprises one element of a plurality of switched voltage dividers being connected between a source of DC voltage and point of reference potential, each of said voltage dividers including at least two circuit elements having an electrical resistance characteristic and respective series connected switch elements connected to a common circuit connection therebetween, said common circuit connection being commonly connected to said capacitor, thereby providing a DC bias voltage at said output terminal and a programmable electrical signal filter having a selectively variable frequency response by operation of said switch elements.

14. A filter according to claim 13 wherein the filter circuit is fabricated in a semiconductor integrated circuit.

15. A filter according to claim 13 wherein said resistive component and said capacitive component are connected as a high-pass filter.

16. A programmable RC filter, comprising:

a capacitor connected between an input terminal and an output terminal;

a plurality of switched voltage dividers being connected between a source of DC voltage and point of reference potential, each of said voltage dividers including at least two series connected active circuit elements which operate both as a resistor and series connected switch and having a common circuit connection therebetween, said common circuit connection being commonly connected to said capacitor and said output terminal and thereby providing an active high pass filter having a programmable frequency response and a DC bias voltage at the output terminal.

17. A programmable RC filter according to claim 16 wherein said active circuit elements are comprised of semiconductor devices.

18. A programmable RC filter according to claim 17 wherein said semiconductor devices are comprised of transistors.

19. A programmable RC filter according to claim 18 wherein said semiconductor devices are implemented in an integrated circuit.

\* \* \* \* \*